United States Patent
Korneluk et al.

(10) Patent No.: US 6,718,164 B1
(45) Date of Patent: Apr. 6, 2004

(54) DYNAMIC METHOD AND APPARATUS FOR CONTROLLING DEVICE TEMPERATURE DURING CONTINUOUS TRANSMISSIONS

(75) Inventors: Jose E. Korneluk, Boynton Beach, FL (US); David S. Seekins, Sunrise, FL (US); Mahesh Bhuta, Coral Springs, FL (US); Anthony Rodrigues, Jr., Lighthouse Point, FL (US); Gordon W. James, Boynton Beach, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/561,082

(22) Filed: Apr. 28, 2000

(51) Int. Cl.$^7$ ............................................... H04B 17/00
(52) U.S. Cl. ................. 455/115.1; 455/67.11; 455/127.1; 455/117; 455/126; 455/128; 219/667; 219/208; 219/209
(58) Field of Search .............................. 455/115.1, 117, 455/127.1, 67.11, 126, 91, 128; 219/667, 208, 209

(56) References Cited

U.S. PATENT DOCUMENTS 5,519,886 A * 5/1996 Gilbert et al.
6,194,968 B1 * 2/2001 Winslow
6,269,251 B1 * 7/2001 Kim
6,473,708 B1 * 10/2002 Watkins et al.

\* cited by examiner

*Primary Examiner*—Sinh Tran
*Assistant Examiner*—Huy D Nguyen
(74) *Attorney, Agent, or Firm*—Scott M. Garrett (57) ABSTRACT

A communication device (100, 200) capable of transmitting information provides the means for regulating the temperature (116) of one or more heat-sensitive modules or components (160) of the communication device through the adaptive and dynamic control of the flow of transmissions by the communication device, thereby eliminating the need for stored thermal profiles of heat-sensitive modules of the communication device. In addition to the heat-sensitive module(s), the communication device has a multi-logic controller block (110) and a transmission flow control block (140). The multi-logic controller block (110) receives the temperature of the heat-sensitive module (116) and a first control clock (112) and utilizes multi-value logic to generate a flow control signal having hysteresis (126). The flow control block (140) is coupled to the multi-logic controller block (110) and the heat-sensitive module(s) (160) and operates to generate a transmission control signal adapted to control transmission of information by the communication device in accordance with the flow control signal (126) and a second control clock (142) provided to the flow control block (140).

15 Claims, 8 Drawing Sheets

| SYSTEM INPUT | MEMBERSHIP FUNCTIONS | CONTROLLER INPUTS |
|---|---|---|
| TEMPERATURE | VERY COLD | TEMPERATURE IS VERY COLD |
| | COLD | TEMPERATURE IS COLD |
| | COOL | TEMPERATURE IS COOL |
| | NORMAL | TEMPERATURE IS NORMAL |
| | WARM | TEMPERATURE IS WARM |
| | HOT | TEMPERATURE IS HOT |
| | VERY HOT | TEMPERATURE IS VERY HOT |

*FIG. 3*

| SYSTEM INPUT RANGE | DEGREE OF MEMBERSHIP |
|---|---|
| A | 0 |
| B | (X−POINT) ∗SLOPE 1 |
| C | MAX |
| D | (POINT 2−X)∗SLOPE 2 |
| E | 0 |

```
                    TEMP 116
            VC  CD  CL  NO  WA  HO  VH
        NL  NL  NL  NL  NL  NL  NL  PL
        NM  NL  NL  NL  NL  NL  NL  PL
   dT   NS  NL  NL  NL  NS  PS  PL  PL      RULE MATRIX
   118  ZE  NL  NL  NM  ZE  PM  PL  PL
        PS  NL  NL  NS  PS  PL  PL  PL
        PM  NL  PL  PL  PL  PL  PL  PL
        PL  NL  PL  PL  PL  PL  PL  PL
                    Cin 122
```

RULEBASE 182

1) IF TEMP_IS_VC AND dT_IS_NL THEN Cin_IS_NL, WEIGHT W1
2) IF TEMP_IS_VC AND dT_IS_NM THEN Cin_IS_NL, WEIGHT W2
3) IF TEMP_IS_VC AND dT_IS_NS THEN Cin_IS_NL, WEIGHT W3
4) IF TEMP_IS_VC AND dT_IS_ZE THEN Cin_IS_NL, WEIGHT W4
•
•
•
49) IF TEMP_IS_VH AND dT_IS_PL THEN Cin_IS_PL, WEIGHT W49

DYNAMIC METHOD AND APPARATUS FOR CONTROLLING DEVICE TEMPERATURE DURING CONTINUOUS TRANSMISSIONS

FIELD OF THE INVENTION

The present invention relates generally to communication devices, and more particularly, to temperature control of communication devices.

BACKGROUND OF THE INVENTION

Many communication devices, including wireless communication devices, have electronic modules or components that are capable of generating a significant amount of heat during normal operation. Portable two-way wireless radio communication devices, capable of voice and data communications, are commonly subject to continuous transmission of information, according to various packet data communication protocols, that can exacerbate the amount of heat generated by these electronic modules or components. Such wireless radio communication devices will typically include a radio-frequency power amplifier (RF PA) that operates to amplify radio signals that are to be transmitted by an antenna of the radio. Power amplifiers are characteristically inefficient and high capacity RF-PA's can generate a substantial amount of heat, particularly under continuous transmission conditions, which may not be adequately dissipated by a device heat sink or other heat dissipation mechanism, even if the heat sink is located in close proximity to the RF PA. With the trend to miniaturize communication devices continuing unabated, these heat sinks or other heat dissipation mechanisms that are provided to dissipate heat from heat-sensitive modules all too often prove to be inadequate to the task. When the heat generated by such electronic modules or components exceeds the heat dissipation capability of the communication device, critical heat-sensitive modules of the communication device, such as the RF PA and surrounding heat-sensitive components of the device, may be easily damaged.

Controlling device temperature of a heat-sensitive module of a communication device typically relies upon a priori information about the thermal characteristics of the heat-sensitive module, commonly referred to as the thermal profile of the heat-sensitive module, that is stored in the communication device. U.S. Pat. No. 5,519,886, issued May 21, 1996 to Gilbert et al., for instance, discloses the use of a priori thermal information to control a heat-sensitive module. This approach, however, presents various problems that the present invention seeks to overcome. First, the thermal characteristics of the heat-sensitive module must be profiled and stored in permanent storage before the device can operate. Second, because the thermal profile of the module is static and unchanging, it does not allow for the natural aging of device modules or components over time. Third, the thermal profile cannot include time periods of previous transmissions of the device, defined by start and stop times, and this information must be updated during operation of the communication device. Fourth, the stored profile is simply an approximation of the actual thermal profile during operation and thus the accuracy of the thermal profile is directly proportional to the size of the storage space dedicated to the profile. Moreover, the stored thermal profile contains thermal characteristics only for a particular heat-sensitive module of the communication device and thus the thermal profile is not readily applicable for other modules. Typical RF PAs for portable two-way wireless radio communication devices, for instance, come in a wide variety of designs and power ratings, from 2 Watts to 22 Watts and higher, for instance, and so the thermal profile for an RF PA rated at 22 Watts of a certain design and manufacturer would not necessarily be applicable to an RF PA rated at 2 Watts of another design and manufacturer. Fifth, because it is not practical to store an unlimited number of thermal profiles that would be representative of each of the possible operating conditions to which the module might be subjected, the stored data points of the profile are used to derive various points along the thermal profile that correspond to the current operation conditions of the module. These thermal profile calculations are processor-intensive operations that require interpolation and approximation techniques that are inherently prone to round-off error.

There is therefore an unmet need in the art to be able to control the temperature of a communication device, particularly those increases in the temperature of heat-sensitive modules or components that are attributable to transmission conditions of the communication device, in a manner that overcomes the various shortcomings of the prior art.

BRIEF DESCRIPTION OF THE DRAWINGS

The novel features believed characteristic of the invention are set forth in the claims. The invention itself, however, as well as the preferred mode of use, and objects and advantages thereof, will best be understood by reference to the following detailed description of an illustrative embodiment when read in conjunction with the accompanying drawing (s), wherein:

DETAILED DESCRIPTION OF THE INVENTION

Figure 1:
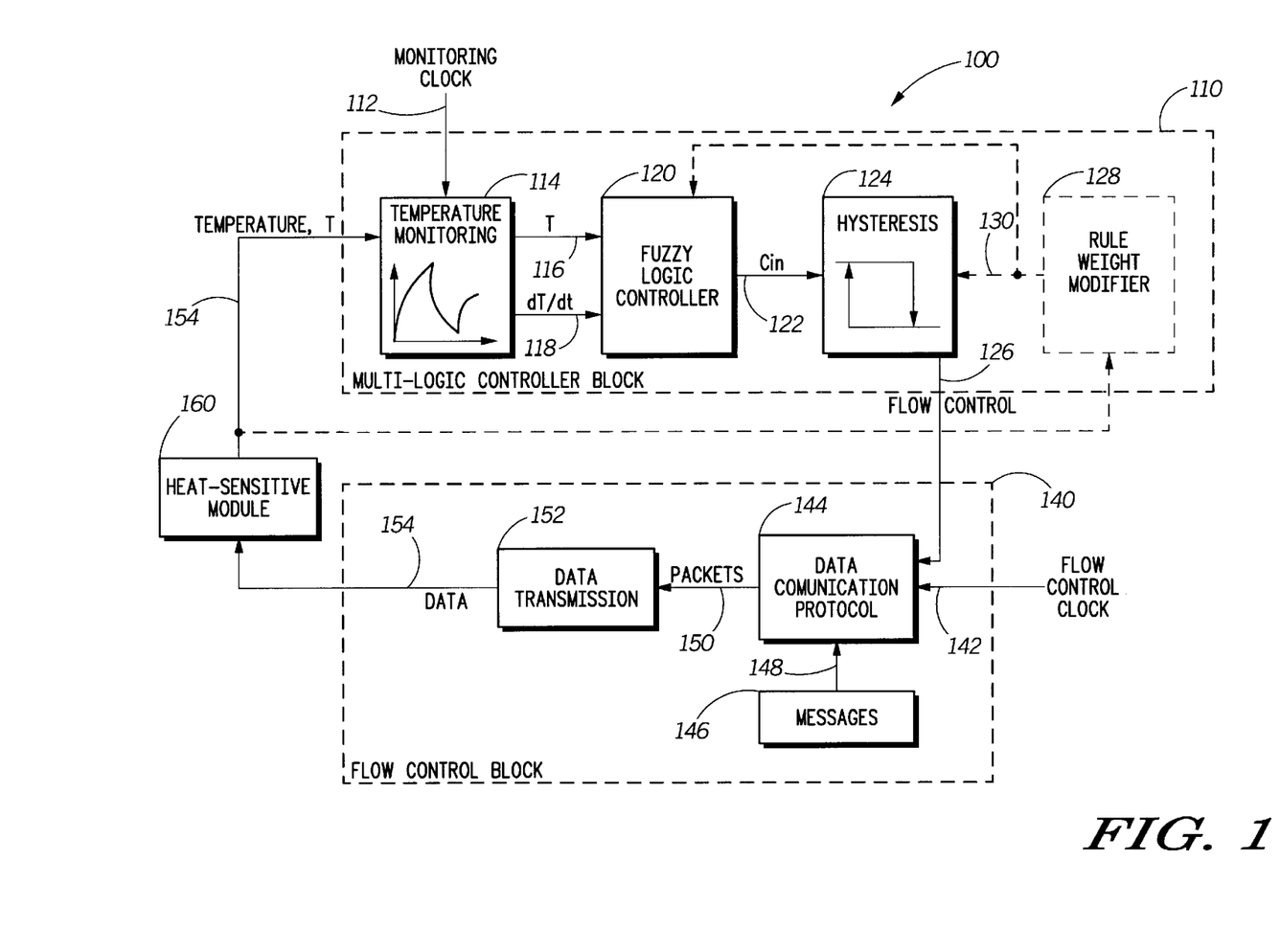
FIG. 1 is a functional block diagram of temperature control in a communication device, in accordance with the present invention.

Referring now to FIG. 1, a functional block diagram 100 of temperature control in a communication device, in accordance with the present invention, is shown. In the communication device, three functional blocks are of importance: multi-logic controller block 110, flow control block 140, and the heat-sensitive module 160. The temperature T 154 of heat-sensitive module 160 of the communication system is monitored periodically by temperature monitoring block 114 in accordance with monitoring clock 112, which triggers the temperature monitoring. Monitoring clock 112, for instance, may cause temperature monitoring block 114 to measure the temperature T 154 of heat-sensitive module 160 every 2 seconds or some other appropriate time interval. Temperature monitoring of the heat-sensitive module of the communication device may be accomplished a variety of ways. Where the heat-sensitive module is a radio frequency power amplifier (RF PA) of a radio, for instance, a temperature sensitive element located on the printed circuit board (PCB) on which the heat-sensitive module resides may be used to measure the temperature of the RF PA. This temperature may be monitored by a software task executing in the radio and may be read by calling a software module that provides the temperature of the RF PA.

The temperature profile of the heat-sensitive module cannot be expected to be linear and typically does change, depending upon the initial temperature at which transmission by the communication device began. It is thus necessary to not only know the current temperature T 116 of the heat-sensitive module (RF PA) but also to ascertain the rate of change of the temperature dT/dt 118. The first derivative of the temperature, dT/dt, over a time interval of an integer number of time slots, assuming the radio is operating in a Time Division Multiplexed (TDM) channel protocol system, is therefore calculated by subtracting the temperature measured during the previous interval from the current temperature measurement T in order to determine how fast the temperature is rising or falling. The number of time slots over which the temperature is monitored may be selected as appropriate to the expected rate of temperature change for a particular heat-sensitive module of the communications device. The temperature T and the rate of change of temperature dT/dt are input signals 116, 118, respectively, provided to multi-value logic (so-called "fuzzy logic") controller 120 which pre-processes these input values and generates a control signal Cin 122. Hysteresis block 124 introduces hysteresis to control signal Cin 122 and generates flow control signal 126, the signal that is provided to flow control block 140. Operation of flow control block 140 will now be described; the operation of multi-value logic controller 120 will be discussed later.

The flow control signal 126 generated by multi-logic controller block 110 is received by flow control block 140. Based upon flow control signal 126, the blocks within flow control block 140 operate to control when the communication device will start and stop the transmission of information, i.e. the flow of transmission. In the communication device, a message 148 is obtained from a message queue 146 for transmission over a communication link, such as a communication link established on a wireless radio frequency carrier. The message transmission is governed by a data communication protocol 144 that controls the parameters of data transmission over the communication link. Data communication protocol 144, for instance, may include instructions for delaying or stopping transmission of at least a portion of a message or for segmenting a message. The message is digitally processed by data communication protocol 144 to produce packets of data for transmission by a data transmission block 152. As is understood in the art, the transmission of packets of data 150 over the communication link by the data transmission block 152 typically operates to increase the temperature of heat-sensitive module 160, as reflected in the temperature monitoring function periodically performed by temperature monitoring block 114. Temperature control of heat-sensitive module 160 is provided by manipulating the operation of data communication protocol 144 in accordance with the flow control signal 126 and flow control clock 142 in order to reduce deleterious temperature effects on the heat-sensitive module 160 caused by data communication transmissions 154.

Of particular interest in the present invention is the generation of flow control signal 126 by multi-value logic controller 120 and hysteresis block 124 of multi-logic control block 110 to efficiently control the flow of transmission of information by the communication device without the need for stored thermal profile characteristics of the heat-sensitive module 160, a definitive improvement in the art. The operation of multi-value logic controller 120 of multi-logic controller block 110 will now be explained in more detail.

Figure 2A:
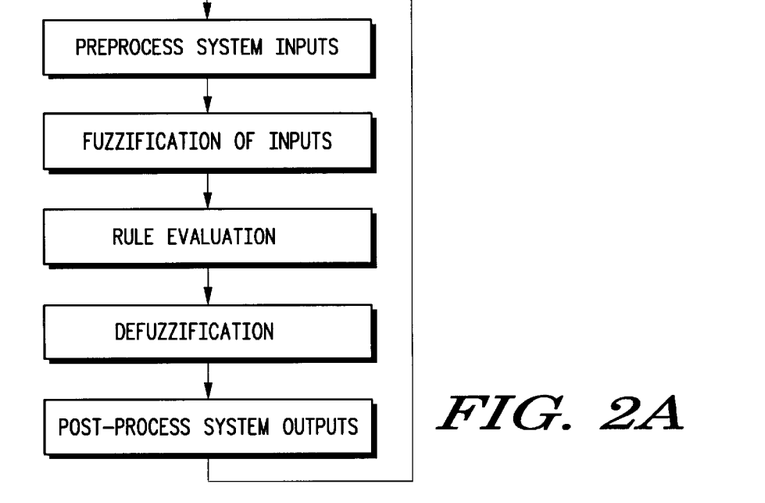
FIG. 2A is a flowchart that illustrates a generalized fuzzy control loop, in accordance with the present invention.
Figure 2B:
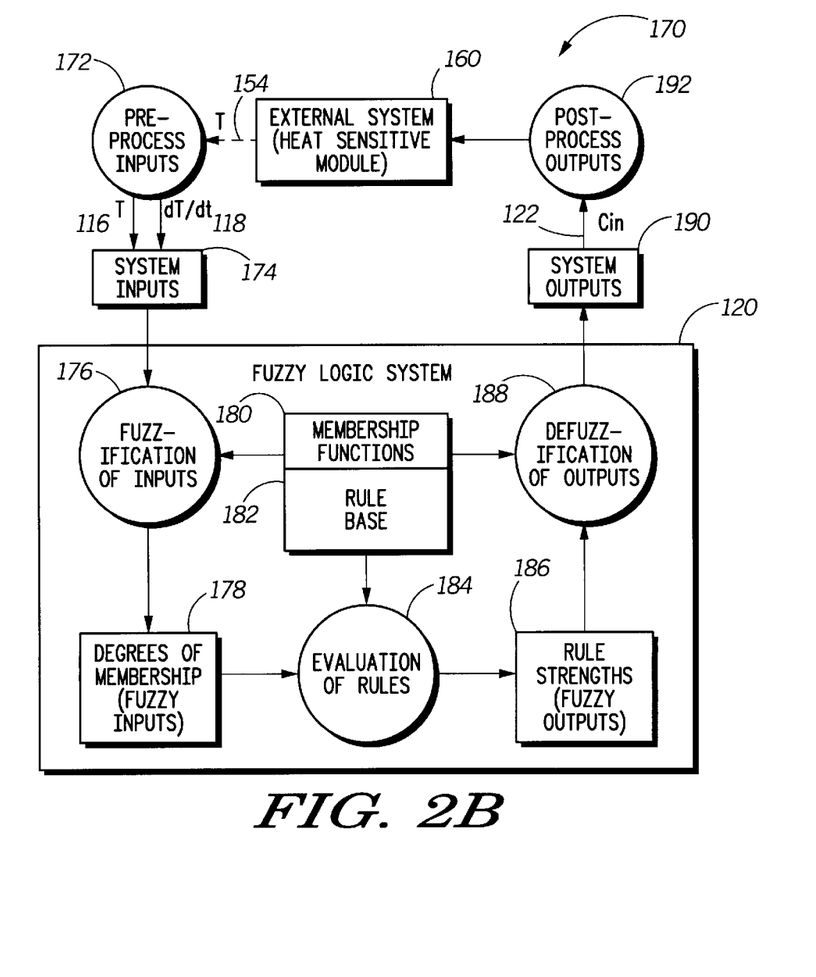
FIG. 2B is a block diagram that illustrates the operation of a multi-value logic controller used to functionally control the temperature of a heat-sensitive module of a communication device, in accordance with the present invention.

The present invention employs a multi-value logic, or so-called "fuzzy logic," via multi-value logic controller 120 to monitor, evaluate, and help control an external system, in this case the heat-sensitive module or component of the communication system. It will be understood by those of ordinary skill in the art that the operation of a fuzzy logic controller is characterized by a generalized fuzzy control loop with a sequence of steps that is endlessly executed as often as needed to maintain control, as depicted in FIG. 2A. FIG. 2A illustrates the functional steps undertaken by the fuzzy logic system, reflected in the functional block diagram of FIG. 2B, for maintaining control. Referring now to FIG. 2B, functional block diagram 170 illustrates the operation of multi-value logic controller 120 to functionally control the temperature of the heat-sensitive module 160, such as a temperature-sensitive RF PA of a wireless two-way radio communication system, in accordance with the present invention. It can be seen that the temperature and rate of change of the temperature of the heat-sensitive module, as measured and produced by temperature monitoring block 114, are pre-processed at 172 and then provided as system inputs at 174 to the multi-value logic controller system 120. These system inputs are processed at 176 (Fuzzy Inputs) to make them usable in a multi-value logic environment and the degrees of membership of the discrete, crisp inputs in various membership functions 180, such as hot, cold, etc., are determined, as will be described below. Evaluation of the flow control rules 184 of a rule base 182 that has been constructed to describe the relationships between the input values temperature T 116 and rate of change of temperature dT/dt 118 that govern the behavior of the multi-value logic controller occurs next. The evaluation of the flow control rules from the rules base at 184 defines rule strengths (Fuzzy Outputs) 186. The rule having the greatest strength of the flow control rules is selected to be output at 190 as control output signal Cin 122 after it has undergone "defuzzification" to be made a crisp value. The control output signal Cin 122 of multi-value logic controller 120 undergoes post-processing at 192 by hysteresis block 124 of FIG. 1 (to generate flow control signal 126) and by the various functional blocks of flow control block 140 to render the transmission control necessary to control the temperature of heat-sensitive module 160.

The various aspects of the functional blocks of FIG. 2B will now be described in more detail. The temperature T 116 and the rate of change of temperature dT/dt 118 input parameters presented to the multi-value logic controller provide status information about the heat-sensitive module to the multi-value logic system. These inputs might typically require some pre-processing at 172, such as normalizing or scaling, analog-to-digital conversion, etc., in order to fit the range of the multi-value logic system. Accordingly, the temperature and dT/dt input parameters must be scaled over a selected input temperature (one range for the temperature T and one for the rate of change of temperature dT/dt) according to the operating conditions of the device in question and temperature threshold points must be defined. The selected range is a function of the particular communication device of interest. Suppose, for instance, that the communication device is a two-way portable wireless radio having a normal operating temperature range of −20° C. to +60° C. and a storage temperature range of −40° C. to +85° C. Assuming that a 16-bit range is to be used and temperatures less than zero ° C. are discarded, for instance, the temperature input range for 0° C. to +128° C. over a 16-bit range is 165536/128, or 512 steps/° C. Even though 85° C. is less than 128° C., the upper end of the range, the difference between 85° C. and 128° C. provides room in the range to accommodate future communication devices that may have higher shutdown threshold temperatures. The temperature range can contain one or more threshold points; a threshold point is an established limit that, when reached or exceeded, indicates that an action is required. The 85° C. safety shutdown temperature is a threshold point of the defined temperature range.

So-called "fuzzification" of system inputs 174 resulting from this preprocessing next occurs by dynamically calculating temperature threshold points over the selected temperature range. Dynamically calculating the temperature threshold points of the selected temperature range occurs by sorting the measured temperature T 116 and the derived rate of change of temperature dT/dt into appropriate membership functions 180. The temperature T 116 is sorted into one or more temperature membership functions and the rate of change of temperature dT/dt 118 is also sorted into one or more rate of change of temperature membership functions. The degree of membership 178 of both the temperature T and the rate of change of temperature dT/dt must next be determined. This involves determining the degree of membership of temperature T 116 in the various temperature membership functions into which it was sorted and also determining the degree of membership of rate of change of temperature dT/dt 118 in the various rate of change of temperature membership functions into which it was sorted. These functional blocks 176 and 178 will now be described in more detail below.

Figure 3:
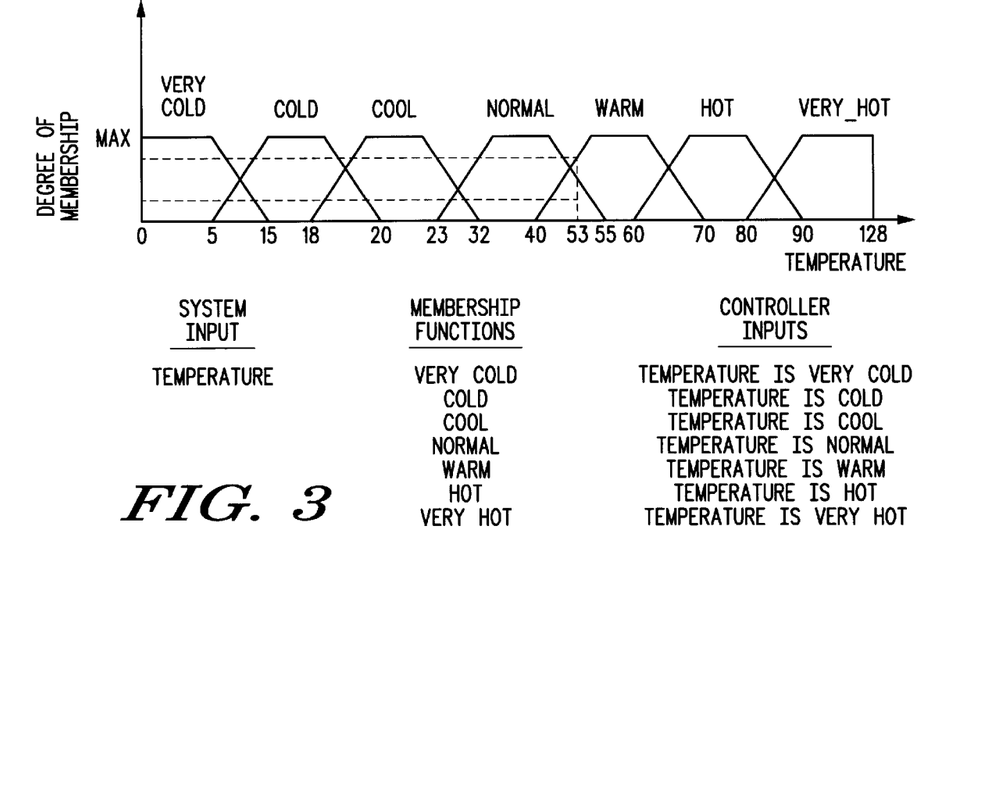
FIG. 3 illustrates the use of multi-valued logic to describe the input temperature T of a heat-sensitive module in terms of membership functions and degree of membership, in accordance with the present invention.
Figure 4A:
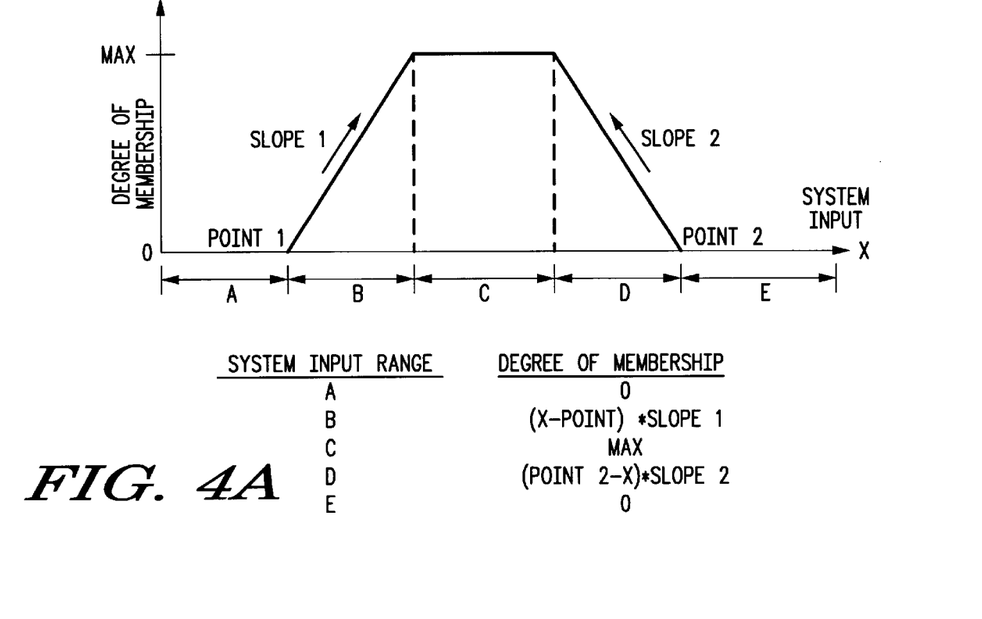
FIG. 4A illustrates the multi-value logic concept of degree of membership for a membership function, in accordance with the present invention.
Figure 4B:
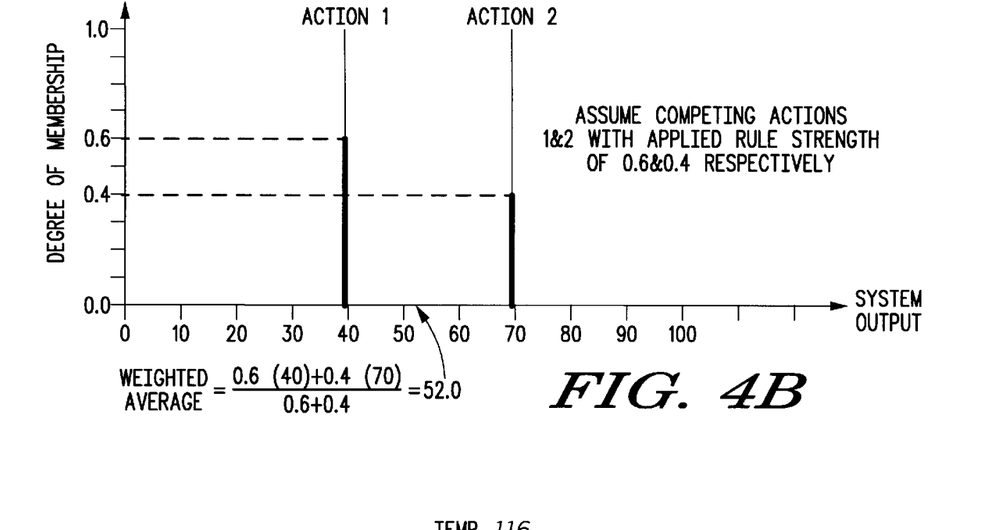
FIG. 4B illustrates the multi-value logic concept of defuzzification using singleton output functions, in accordance with the present invention.

Dynamic calculation of threshold points of the temperature range is accomplished by sorting the temperature and temperature slope dT/dt input parameters into categories that describe in broad terms the present operating point of the heat-sensitive module of the communication device. So-called "fuzzy logic" or multi-valued logic is employed for this task. Referring now to FIG. 3, multi-valued logic is employed to describe the input temperature T of the heat-sensitive module 160. It can be seen that seven membership functions are defined: very cold, cold, cool, normal, warm, hot, and very hot; these membership functions correspond to the following controller input signals: temperature_is_very_cold, temperature_is_cold, temperature_is_cool, temperature_is_normal, temperature_is_warm, temperature_is_hot, and temperature_is_very_hot. Again using the temperature range of 0° C. to 128° C., the cold membership function might have a sub-range of 5° C. to 20° C.; the normal membership function a sub-range of 23° C. to 55° C.; the warm membership function a sub-range of 40° C. to 70° C.; the hot membership function a sub-range of 60° C. to 90° C.; and the very hot temperature function a sub-range of 80° C. to 128° C. as illustrated in FIG. 3. The sub-ranges that correspond to the various membership functions may be defined any number of ways, as dictated by fuzzy logic principles. FIGS. 3–4 use trapezoidal membership functions defined by two points and two slopes per membership function. Of course, one of ordinary skill in the art will recognize that the foregoing temperature sub-ranges are by way of example only and may of course change without departing from the spirit and scope of the invention. One of ordinary skill in the art will appreciate that the type and number of temperature membership functions may be changed from the example disclosed herein without departing from the spirit and scope of the invention.

From FIG. 3 it can be seen that the system input of measured temperature T 116 may or may not fall squarely within a discrete membership function. An input temperature of 53° C., for instance, clearly falls into both the normal and warm membership functions by varying degrees; it appears that 53° C. falls more within the "warm" membership function than within the "normal" membership function, for example. It is thus necessary to determine the degree of membership of the temperature T and similarly rate of change of temperature dT/dt inputs 116, 118, respectively, within any given membership function, as indicated in Block 178 of FIG. 2B. Each of the five input temperature membership functions cold, normal, warm, hot, and very hot may be described by four points and two slopes, as shown in FIG. 4A, over the 0° C. to 128° C. input range for the temperature and over an appropriate temperature range, such as −16° C. to +16° C., for the rate of change of temperature dT/dt. Where the temperature input falls within the five ranges A, B, C, D, and E of a particular membership function will determine its degree of membership for that membership function. Thus a temperature that falls within the A or E ranges is clearly outside the membership function and has a degree of membership in the membership function of 0. A temperature that falls within the C range clearly enjoys a maximum degree of membership within the range. A temperature input value that falls within either the B or D ranges is more complex and is determined according to the formulas shown in FIG. 4A. For example, a temperature input value that falls within the B range is determined according to the formula: (X-point 1)*slope 1, where X is the input value, point 1 is the beginning point of the B range, and slope 1 is the slope of the B range as shown in the figure. A temperature input value that falls within the D range is determined according to the formula: (point 2-X)*slope 2, where X again is the input value, point 2 is the ending point of the D range, and slope 2 is the slope of the D range as shown in the figure.

The temperature slope, or rate of change of the temperature dT/dt, is processed in the same fashion with respect to seven input membership functions describing the rate of change of the temperature: negative_large, negative_medium, negative_small, zero, positive_small, positive_medium, and positive_large. The temperature slope range for the rate of change of the temperature dT/dt might well be −16° C. to +16° C., for example. It will be understood by one of ordinary skill in the art that other types and numbers of rate of temperature membership functions might be chosen, according to the rules set by fuzzy logic theory, without departing from the spirit and scope of the present invention.

For many heat-sensitive modules, such as the RF PA of a two-way radio communication device, the heat-up rate is different than the cool-down rate of the heat-sensitive module and so the thermal profile for continuous transmission of the communication device followed by a cool-down period results in an asymmetrical curve that must be compensated for in the temperature monitoring algorithm of the present invention. Moreover, the initial transmission temperature of the RF PA affects the shape of the heat-up curve and thus must be considered when determining the threshold points of the temperature range.

The use of multi-value logic by the present invention addresses these difficulties. Input membership functions do not require the precise calculation of an $n^{th}$ degree polynomial to approximate the asymmetrical operation profile of the heat-sensitive module and thus the present invention eliminates the need for stored heat-up and cool-down thermal profiles of the heat-sensitive module or component that provide a priori information. Significantly, the present invention also eliminates the need for CPU-intensive calculations to determine the precise current operating point of the heat-sensitive module or component.

After processing the temperature and rate of change of temperature input parameters and determining the degree of membership of these parameters within various membership functions 180 into which they have been sorted, one or more rules contained within a rule matrix of a rule base 182 are evaluated. These rules, referred to as flow control or cutback rules since they operate to influence the flow of transmission of information by the communication device, are evaluated in accordance with the degree of membership of temperature T in the one or more temperature membership functions into which T was sorted and also in accordance with the degree of membership of the rate of change of temperature dT/dt in the one or more rate of change of temperature membership functions into which dT/dt was sorted, in order to generate the rule strengths (Block 186) of the relevant rules. During rule evaluation, fuzzy inputs are combined to form fuzzy outputs by computing rule strengths based on antecedent values and then assigning them to the rule's consequents. Once the strengths of the rules are known, defuzzification is performed by Block 188 using a center-of-gravity method to resolve conflicts between competing actions, which may have been triggered by certain conditions during the rule evaluation process. Furthermore, Block 190 maps fuzzy actions to a crisp output control signal Cin that is usable by the external system. By way of example consider FIG. 4B. In contrast to a trapezoidal membership function, a singleton is an output membership function represented by a single vertical line intersecting the horizontal axis representing the System Output. Assuming two competing actions, Action 1 and Action 2, the center-of-gravity defuzzification method is a weighted-average calculation of System Output values and rule strengths, with the rule strengths as weights. It will be understood by one of ordinary skill in the art that other output membership functions and methods of defuzzification might be chosen without departing from the spirit and scope of the invention. Post-processing of control signal Cin 122 at Block 192 includes adding hysteresis (by hysteresis block 124) to generate flow control signal 126 and other processing by the functional blocks of flow control block 140 of FIG. 1 to control the transmission flow of heat-sensitive module 160 and thus the temperature of heat-sensitive module 160.

Figure 5:
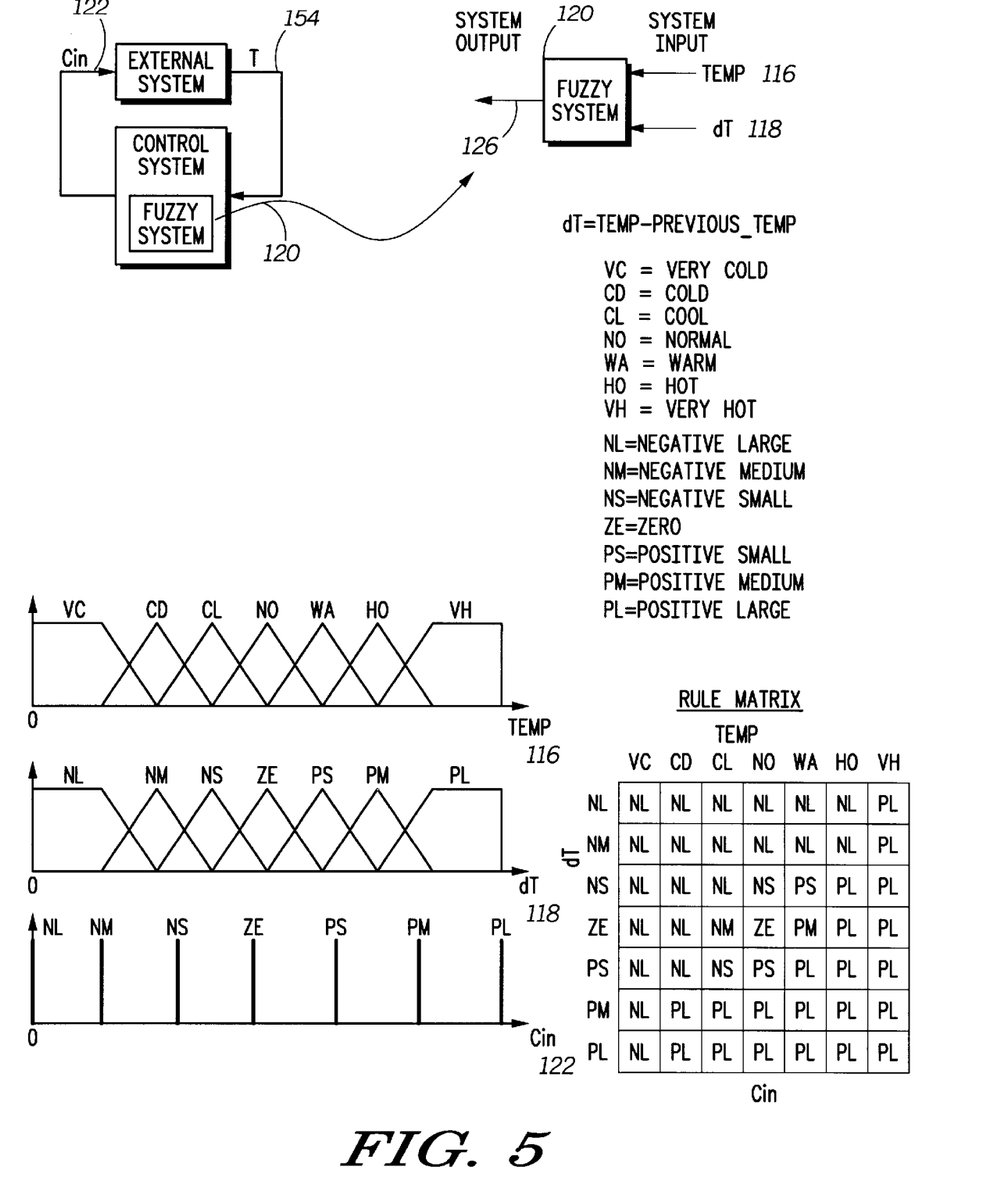
FIG. 5 illustrates the concepts of membership functions and rules for a multi-value logic controller, in accordance with the present invention.
Figure 6:
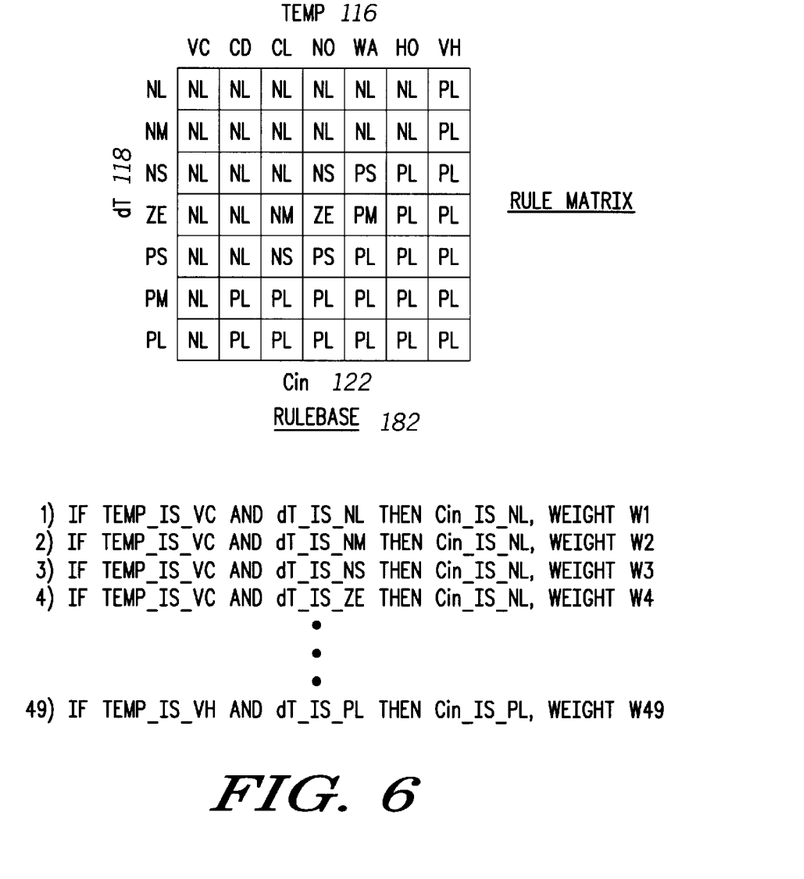
FIG. 6 illustrates a rule matrix and rule base for a multi-value logic controller, in accordance with the present invention.

The rule base 182, expressed in a rule matrix as shown in FIG. 5, is constructed from the set of rules that were developed to express the relationships between the temperature T and rate of change of temperature over time dT/dt inputs 116, 118, respectively, to the multi-value logic controller 120. Each rule of the rule base 182 has the form of an IF-THEN statement, with the IF side of the rule containing one or more conditions, referred to as antecedents, and the THEN side of the rule containing one or more actions, called consequents, and a weight. The antecedents of the rules correspond directly to the fuzzy inputs that hold degree-of-membership values calculated as explained above during fuzzification. The consequents correspond to the variable outputs representative of the various actions that might be taken depending upon the values of temperature and rate of change of temperature over time calculated as explained above during rule evaluation. By way of example, consider the following sample rule: IF temperature_very_hot AND dT_is_PL, THEN Cin_is_PL, WEIGHT 49. This rule would be interpreted to state that if the temperature of the heat-sensitive RF PA module is very hot and the rate of change of the temperature of over time is a large positive increase, then there is positive large flow control of the RF PA, which is this case means to stop the flow or transmission of information by the RF PA until the temperature decreases to a more acceptable level. FIG. 6 illustrates rules from the rule matrix as IF-Then Statements of the rule base 182.

Additionally, every rule of the rule base is weighted according to its perceived relative importance vis-à-vis other rules within the rule base. Some rules may be considered more important than other rules and thus enjoy a greater influence over the generation of the control output signal Cin. After the rule strength is computed, the strength is multiplied by the rule's weight and the weighted rule is part of the rule matrix used to determine the discrete control output signal Cin 122. Optionally, the weights of one or more rules may be dynamically modified at-will by rule weight modifier block 128 (FIG. 1) in response to the temperature generated by heat-sensitive module 160 and provided to rule weight modifier block 128; the modified rule weights 130 would then be made available to hysteresis block 124 of FIG. 1 so as to affect the amount of hysteresis introduced to the control output signal Cin 122.

Once the system is in operation, the membership functions, the rule base/rule matrix, and the various weights assigned the rules do not generally change. The effect of the various flow control rules on the temperature of the heat-sensitive module, however, may be monitored in the context of the device's state, environment, operating conditions, etc. and the rules of the rule base 182 modified accordingly to enhance device operation. The rule base 182 is modified by changing the weights assigned to various rules via rule weight modifier block 128 so as to influence the generation of flow control signal 126 that ultimately determines the manner in which transmission, or flow, of the communication device is controlled to regulate the temperature of the heat-sensitive module. The weights of the rules may be changed by rule weight modifier block 128 at run-time to adapt the system dynamically. Through rule weighting, rules can be dynamically turned on and off, either partially or completely. Changing the weights of one or more rules of the rule base in an appropriate manner can maximize data throughput of the system while at the same time minimizing the amount of time spent in cutback flow control and can also take into account the effects of component or module aging. The optional nature of rule weight modifier block 128 is indicated by the dashed lines that surround this block.

Consider an example in which it is advantageous to undertake the optional feature of changing the weighting of one or more rules. Suppose that through monitoring the operation of the system according to the rule base already in place, it becomes apparent that too much time is required to allow the heat-sensitive module to cool down. Such a situation might result from constant use of the communication device by a user for prolonged periods of time. It would accordingly be preferable to cutback on transmission by the communication device sooner so that the temperature of the module at cutback is lower and thus less time is required for the module to cool down to an acceptable temperature level. To realize this goal, the weightings of one or more rules of the rule base may be modified to cause the module 160 to cool down sooner.

Post-processing of control signal Cin 122 at Block 192 includes having hysteresis added to it by hysteresis block 124 and other processing by the functional blocks of flow control block 140 of FIG. 1 to control the transmission flow of the communication device, and thus the temperature, of heat-sensitive module 160 of the communication device.

Hysteresis is used during the cool-down cycle of the heat-sensitive module to minimize the amount of time during which the communication device is not transmitting due to high temperature of the heat-sensitive module and to thereby increase data transmission throughput of the communication device. Hysteresis causes an increased cutback, or reduction, in packet transmission of the communication device during cool-down to allow the module to cool to a lower temperature, than it would without hysteresis, before resuming transmission. The amount of hysteresis introduced by hysteresis block 124 of FIG. 1 in flow control signal 126 is dependent upon the weights assigned to various rules of the rule base as described previously. After the rules are evaluated, a 3-dimensional (3-D) control surface and transfer plot that represents the output of the rule base over the variations of the defined inputs T and dT/dt can be obtained. From this plot, the beneficial effect of hysteresis during the cool-down cycle is illustrated. The increased cutback of transmission by the communication device during cool-down allows for the heat-sensitive module to cool to a lower temperature before resuming transmission.

Flow control signal 126 generated by hysteresis block 124 and flow control clock 142 are received by flow control block 140. Flow control block 140 is controlled by flow control signal 126 and flow control clock 142 to control the manner in which packets of data 150 received from data communication protocol 144 are transmitted by data transmission block 152 of the communication device. The flow control clock 142 operates asynchronously from monitoring clock 112 and thus provides for control to be applied to the heat-sensitive module or component 160 in an asynchronous manner according to communication device tasks running in real-time. The granularity of the cutback flow control signal is controlled by the flow control clock 142; flow control clock 142 has a time interval of a selected integer number of time slots, for instance, that allows for the simulation of different duty cycles modes of the communication device such as in a Time Division Multiple Access (TDMA) scheme. Through control of the flow control clock 142, then, the communication device may achieve any desired TDMA interleaving, such as a 3:1 TDMA interleave in which the communication device will transmit information once every three slots (representative of a 33% duty cycle), a 6:1 interleave in which the communication device will transmit information once every six slots (representative of a 16% duty cycle), or any other achievable interleave pattern. Those of ordinary skill in the art will appreciate that TDMA is simply a representative implementation and that communication systems may use other access schemes, such as CDMA.

Figure 7:
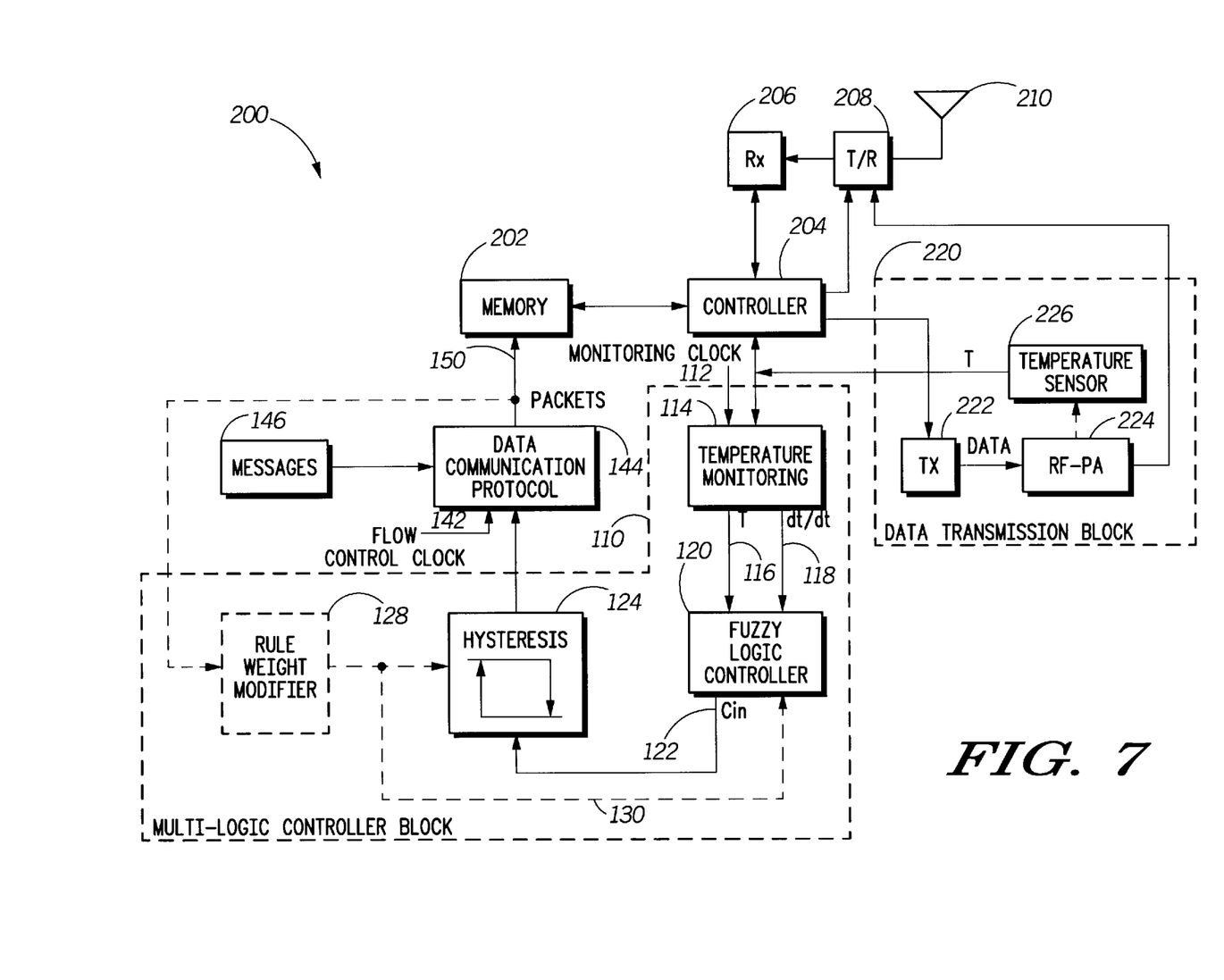
FIG. 7 is a block diagram of a radio communication device capable of receiving and transmitting information, in accordance with the present invention.

Referring to FIG. 7, a block diagram of a radio communication device 200 capable of receiving and transmitting information, in accordance with the present invention, is shown. The heat-sensitive module of communication device 200 is RF Power Amplifier (RF PA) 224. Communication device 200 has a controller 204 that provides operational control of the functions of the device. Controller 204 is coupled to the temperature monitoring block 114, a memory 202, a receiver 206, a transmit/receive switch, and a temperature sensor 226 as shown. Memory 202 includes instructions for implementing the protocol operation modification functionality of blocks 114, 120, 124, 128, and 144. In order for the communication device to receive information, transmit/receive switch 208 is controlled by controller 204 to selectively couple antenna 210 to receiver 206. Receiver 206 is controlled by controller 204 to receive signals transmitted to it. Transmission operations of the communication device 200 are supported by the functionality contained within data transmission block 220. Controller 204 is coupled to and operates to control transmitter 222. For transmission operations, the transmit/receive switch 208 is engaged to couple transmitter 222 to antenna 210 through RF PA 224 so that signals that are transmitted by transmitter 222 are received and amplified by RF PA 224 and radiated through antenna 210. Data transmission block 220 also contains temperature sensor 226 which is capable of measuring the temperature of heat-sensitive modules or components of the communication device 200 that are susceptible to the heat generated by transmission, including RF PA 224. The temperature information collected by temperature sensor 226 is provided to the controller 204 as well as to temperature monitoring block 114.

Data communication protocol 144 governs transmission of messages 146 by the communication device 200. In the preferred embodiment, data communication protocol 144 is implemented using a Packet Data Protocol (PDP), a well known packet-switched protocol or set of rules concerning data communications in which messages from different sources are transmitted over a common communication link to different destinations. In the preferred embodiment, a time division multiplex (TDM) channel protocol is used to allocate a plurality of slots on a communication channel for use by the communication device 200. The PDP allows for the manipulation of protocol parameters to provide flexibility in transmission rates.

Figure 8:
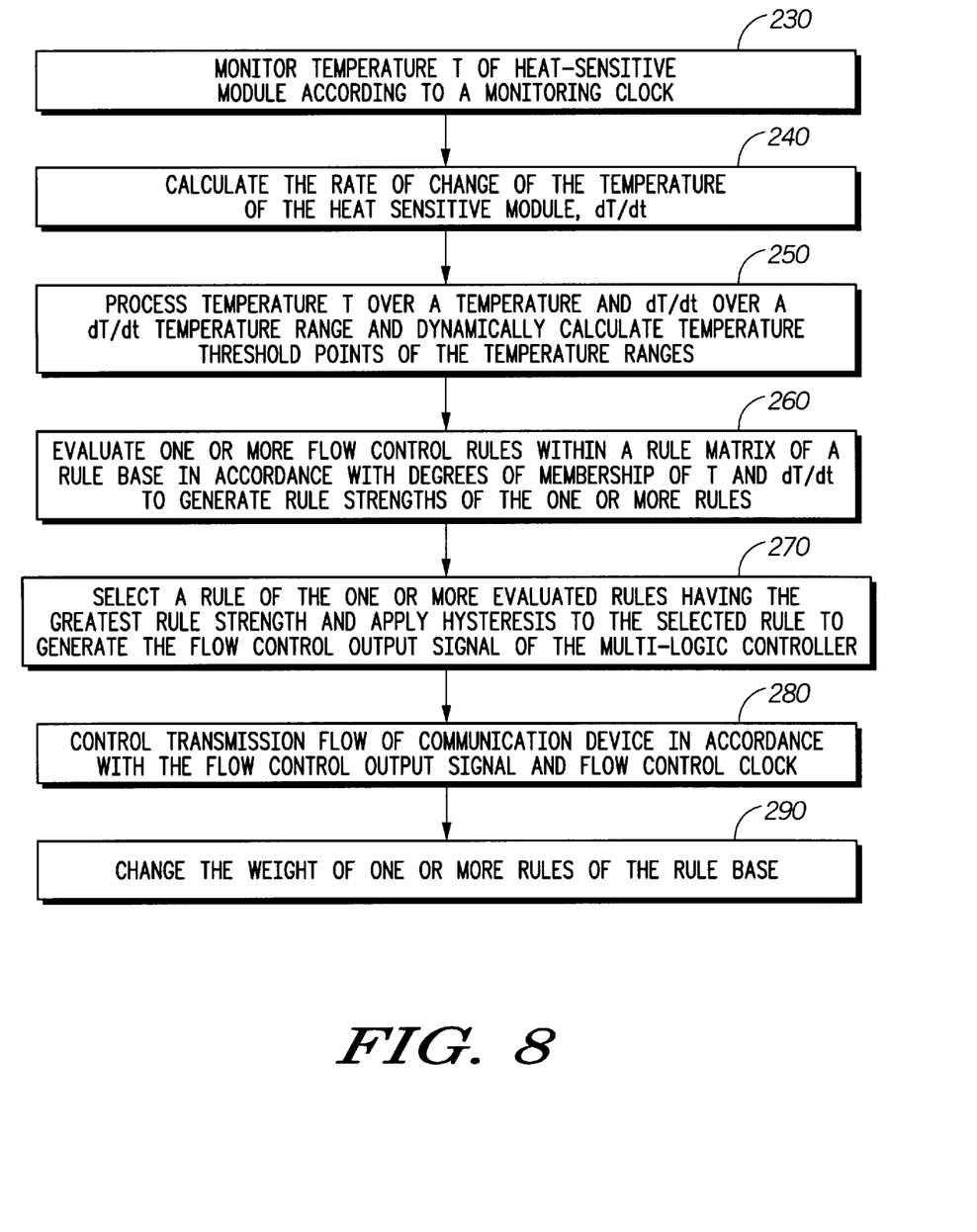
FIGS. 8–10 show flow charts depicting the methodology used by the communication device to provide temperature control of heat-sensitive modules or components during transmission, in accordance with the present invention.
Figure 9:
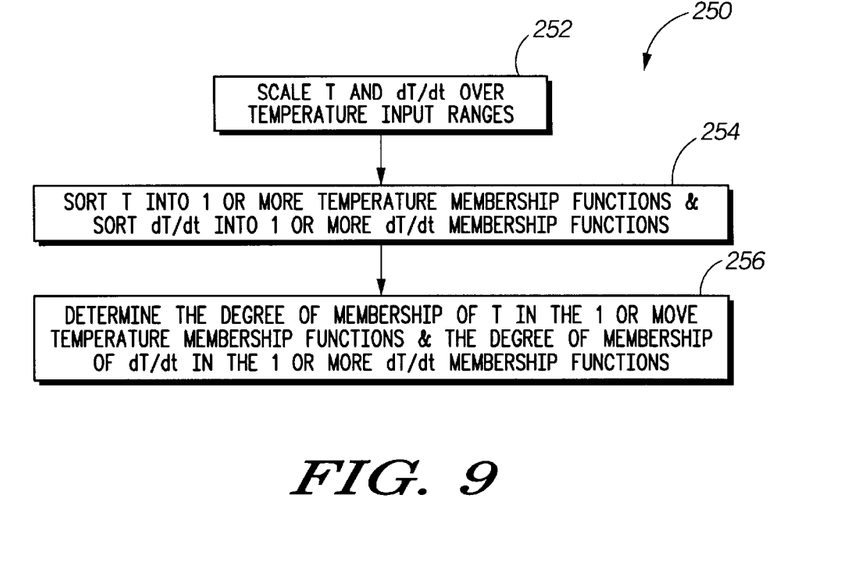
Figure 10:
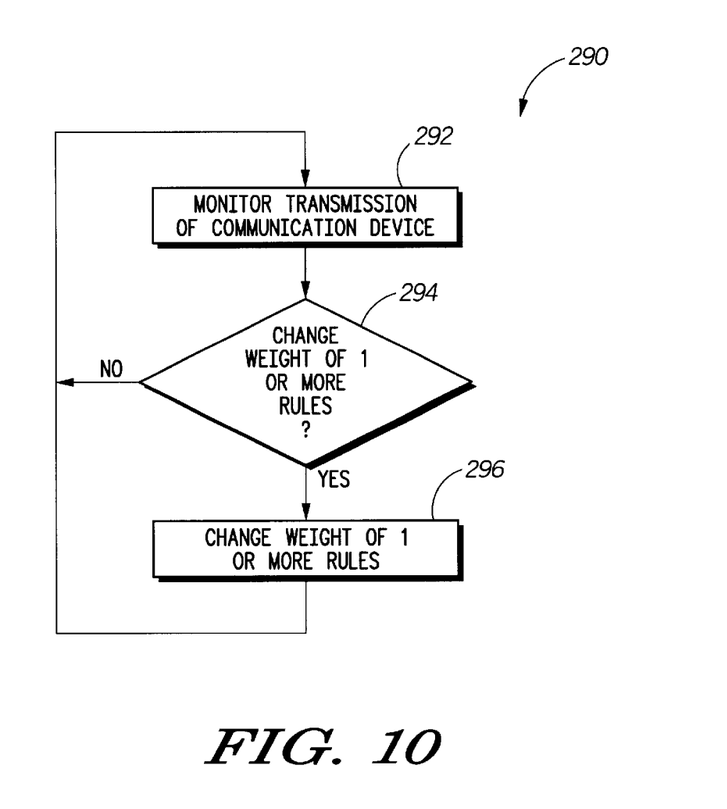

FIGS. 8–10 provide a summary of the methodology used by the communication device to provide temperature control of heat-sensitive modules or components during transmission, in accordance with the present invention. Referring now to FIG. 8, a flow diagram of the overall methodology of the present invention is illustrated. The temperature T of a heat-sensitive module or component of the communication device which is affected by transmissions of the communication device is monitored at Block 230. The monitoring clock 112 triggers monitoring of the temperature of the heat-sensitive module. At Block 240, the rate of change of the measured temperature, dT/dt, is calculated. The rate of change of the temperature with respect to time is needed because the temperature profile of most heat-sensitive components, such as the RF PA, is not linear and will change as a function of the initial temperature at which transmission by the communication device began. dT/dt is calculated by subtracting the temperature measured during the previous time interval or time slot from the temperature measured during the current time interval, again assuming the use of a TDM channel transmission protocol, in order to determine how fast the temperature is rising or falling. At Block 250, the temperature T and rate of change of temperature dT/dt parameters are pre-processed over a selected temperature range and temperature threshold points of the temperature range are dynamically calculated, as illustrated further by Blocks 252–256 of FIG. 9. These input parameters might typically require some pre-processing, such as normalizing or scaling, analog-to-digital converting, etc., in order to fit the range of the multi-value system. Accordingly, the temperature and dT/dt input parameters must be scaled over a selected input temperature range according to their possible values and temperature threshold points must be defined. The selected range is a function of the particular communication device of interest. At Block 252, the temperature T and rate of change of temperature dT/dt are scaled over a selected temperature input range.

Dynamic calculation of threshold points of the temperature ranges is accomplished by sorting the temperature and temperature slope dT/dt input parameters into categories, or membership functions, that describe in broad terms the present operating point of the heat-sensitive module of the communication device. So-called "fuzzy logic" or multi-valued logic is employed for this task. Each of the membership functions occupy a given sub-range of the temperature selected in Block 252. Thus, at Block 254, the scaled temperature T is sorted into one or more appropriate temperature membership functions and the scaled rate of change of temperature dT/dt is sorted into one or more appropriate rate of change of temperature membership functions that occupy a given sub-range of the selected temperature range. Finally, at Block 256, the degree of membership that temperature T has in the one or more temperature membership functions into which it has been sorted is determined. Likewise, the degree of membership that dT/dt has in the one or more rate of change of temperature membership functions into which it has been sorted is determined.

Referring back to FIG. 8, the next step at Block 260 is to evaluate one or more flow control rules contained within a rule matrix of a rule base according to the degree of membership determined for temperature T and the degree of membership determined for dT/dt in their various membership functions, in order to determine the rule strengths of the one or more rules evaluated. At Block 270, the rule having the greatest rule strength is selected and hysteresis is applied to the selected rule to generate the flow control signal 126 of the multi-logic controller block 110 of FIG. 1. Finally, at Block 280 the transmission flow of the communication device is controlled in accordance with the flow control signal generated at Block 270 and the flow control clock 142 in order to effectuate desired temperature control of the heat-sensitive module 160 (FIG. 1). An optional step, as indicated by the dashed lines of Block 290, is to change the weights of one or more rules of the rule base according to Blocks 292–296 of FIG. 10. At Block 292, transmission by the communication device is monitored to yield information about transmission, such as the average length of transmissions and the average intervals between transmissions, that can be used to determine whether transmission control of the communication device is warranted. From this information, it can be determined whether the weights of one or more rules of the rule matrix should be changed at Decision Block 294. If the rule weighting is to be changed, it is changed at Block 296 and communication device transmissions are monitored at Block 292. If, however, the rule weighting of the rules are not to be changed, the flow returns to Block 292. It is noted that the optional step of Block 290 of changing the rule weighting of one or more rules may be undertaken at any time in the flow of FIG. 8 and thus need not occur after Block 280.

The present invention provides significant advantages over the temperature control mechanisms of the prior art. The dual time-based calculations of rate of change of temperature, according to the monitoring clock, and of the multi-value logic processing of temperature T and rate of change of temperature dT/dt, according to the flow control clock, allow for greater control of the overall system by asynchronously monitoring input parameters and exercising flow control, each with its own independent clock, the rate of which is optimally suited to the operation being performed. Fuzzy logic eliminates the need for stored temperature profiles of heat-sensitive modules or components of the communication device. Since thermal profiles are not stored, the improved monitoring and control scheme of the present invention can easily operate on a plurality of heat-sensitive modules that have widely varying ratings. For instance, the present invention may be used for RF PA's of varying physical sizes, manufacturers, and power ratings with equally good results. Additionally, because thermal profiles that require extensive processing are not stored the present invention is much less processor-intensive.

The use of multi-value or fuzzy logic itself offers important improvements, including quicker development time since less device tuning is required without sacrificing stability, increased maintainability of the temperature monitoring and control algorithms used in the communication device, enhanced performance since the fuzzy logic controller may be dynamically adapted to change at-will the manner in which overheating of heat-sensitive modules is addressed, and improved ruggedness and reliability.

While the invention has been particularly shown and described with reference to one or more preferred embodiments, it will be clearly understood by those of ordinary skill in the art that the invention is not so limited. Numerous modifications, changes, variations, substitutions and equivalents may be made therein without departing from the spirit and scope of the invention.

What is claimed is:

1. A method of controlling device temperature, comprising:

monitoring a temperature of a heat-sensitive module of a communication device in accordance with a first control clock;

calculating a rate of change of temperature (dT/dt) of the heat-sensitive module;

processing the temperature over a temperature range to generate a scaled temperature and processing the dT/dt over a dT/dt range to generate a scaled dT/dt;

dynamically calculating one or more temperature threshold points of the temperature range and the dT/dt range by determining degree of membership of the scaled temperature in one or more temperature membership functions and determining degree of membership of the scaled dT/dt in one or more dT/dt membership functions;

evaluating one or more rules of a plurality of rules of a rule base of the communication device, each rule of the plurality of rules having a weight, in accordance with the degree of membership of the scaled temperature in the one or more temperature membership functions and the degree of membership of the scaled dT/dt in the one or more dT/dt membership functions to generate a rule strength for each rule of the one or more rules;

selecting a rule of the one or more rules having the greatest rule strength;

applying hysteresis to the selected rule to generate a flow control signal; and controlling a transmission flow of the communication device in accordance with the flow control signal and a second control clock.

2. The method according to claim 1, wherein preprocessing the temperature and the dT/dt comprises:
   selecting the temperature range and the dT/dt range; and
   scaling the temperature over the selected temperature range to generate the scaled temperature and scaling the dT/dt over the selected dT/dt range to generate the scaled dT/dt.

3. The method according to claim 1, wherein dynamically calculating the one or more temperature threshold points of the temperature range and the dT/dt range comprises:
   sorting the scaled temperature into the one or more temperature membership functions of a plurality of temperature membership functions that each define a sub-range of the temperature range and sorting the scaled dT/dt into the one or more dT/dt membership functions of a plurality of dT/dt membership functions that each define a sub-range of the dT/dt range; and
   determining the degree of membership of the scaled temperature in the one or more temperature membership functions into which the scaled temperature is sorted and determining the degree of membership of the scaled dT/dt in the one or more dT/dt membership functions into which the scaled dT/dt is sorted.

4. The method according to claim 1, further comprising:
   modifying the weight of at least one rule of the one or more rules of the rule base to change the flow control signal generated for a given operating condition of the communication device.

5. The method according to claim 4, wherein modifying the weight of at least one rule further comprises:
   monitoring transmissions of the communication device in order to gather transmission information;
   determining whether the transmission information gathered indicates that the flow control signal should be changed; and
   if the flow control signal should be changed, modifying the weight of the at least one rule to change the flow control signal.

6. A method of controlling device temperature, comprising:
   monitoring a temperature of a heat-sensitive module of a communication device in accordance with a first control clock;
   calculating a rate of change of temperature (dT/dt) of the heat-sensitive module;
   preprocessing the temperature over a temperature range and processing the dT/dt over a dT/dt range, further comprising:
      selecting a temperature range and a dT/dt range; and
      scaling the temperature over the selected temperature range to generate a scaled temperature and scaling the dT/dt over the selected dT/dt range to generate a scaled dT/dt;
   dynamically calculating one or more temperature threshold points of the temperature range, further comprising:
      sorting the scaled temperature into one or more temperature membership functions of a plurality of temperature membership functions that each define a sub-range of the selected temperature range and sorting the scaled dT/dt into one or more dT/dt membership functions of a plurality of dT/dt membership functions that each define a sub-range of the selected dT/dt range; and
      determining degree of membership of the scaled temperature in the one or more temperature membership functions into which the scaled temperature is sorted and determining degree of membership of the scaled dT/dt in the one or more dT/dt membership functions into which the scaled dT/dt is sorted;
   evaluating one or more rules of a plurality of rules of a rule base of the communication device, each rule of the plurality of rules having a weight, in accordance with the degree of membership of the scaled temperature in the one or more temperature membership functions and the degree of membership of the scaled dT/dt in the one or more dT/dt membership functions to generate a rule strength for each rule of the one or more rules;
   selecting a rule of the one or more rules having the greatest rule strength;
   applying hysteresis to the selected rule to generate a flow control signal; and
   controlling a transmission flow of the communication device in accordance with the flow control signal and a second control clock.

7. The method according to claim 6, further comprising:
   modifying the weight of at least one rule of the one or more rules of the rule base to change the flow control signal generated for a given operating condition of the communication device.

8. The method according to claim 7, wherein modifying the weight of at least one rule further comprises:
   monitoring transmissions of the communication device in order to gather transmission information;
   determining whether the transmission information gathered indicated that the flow control signal should be changed; and
   if the flow control signal should be changed, modifying the weight of the at least one rule to change the flow control signal.

9. A communication device, comprising:
   a heat-sensitive module of the communication device having a temperature that is affected by transmission of information by the communication device;
   a multi-logic controller block that receives the temperature of the heat-sensitive module and a first control clock and generates a flow control signal having hysteresis, comprising:
      a temperature monitoring element operatively coupled to the heat-sensitive module that periodically monitors the temperature of the heat-sensitive module in accordance with the first control clock provided to the temperature monitoring element and generates a rate of change of temperature (dT/dt) from the temperature of the heat-sensitive module;
      a multi-value logic controller coupled to the temperature monitoring element that receives the temperature and the dT/dt and generates an output signal, the multi-value logic controller adapted to:
         process the temperature over a temperature range to generate a scaled temperature and process the dT/dt over a dT/dt range to generate a scaled dT/dt;
         sort the scaled temperature into one or more temperature membership functions of a plurality of temperature membership functions that each define a sub-range of the temperature range and sorting the scaled dT/dt into one or more dT/dt membership functions of a plurality of dT/dt membership functions that each define a sub-range of the dT/dt range;

determine degree of membership of the scaled temperature in the one or more temperature membership functions into which the scaled temperature is sorted and determine degree of membership of the scaled dT/dt in the one or more dT/dt membership functions into which the scaled dT/dt is sorted;

evaluate one or more rules of a plurality of rules of a rule base of the communication device, each rule of the plurality of rules having a weight, in accordance with the degree of membership of the scaled temperature in the one or more temperature membership functions and the degree of membership of the scaled dT/dt in the one or more dT/dt membership functions to generate a rule strength for each rule of the one or more rules; and select a rule of the one or more rules having the greatest rule strength; and a hysteresis element coupled to the multi-value logic controller adapted to add hysteresis to the selected rule to generate the flow control signal; and a transmission flow control block coupled to the multi-logic controller block and operatively coupled to the heat-sensitive module that receives the flow control signal from the multi-logic controller block and generates a data transmission control signal adapted to control transmission of information by the communication device in accordance with a second control clock.

10. The communication device according to claim 9, wherein the transmission flow control block comprises:

a data communication protocol element that receives the flow control signal and information to be transmitted by the communication device, the data communication protocol element adapted to process the information to be transmitted according to a plurality of transmission parameters that govern transmission of the information over a communication link to produce packets of data for transmission over the communication link; and a data transmission element coupled to the data communication protocol element that receives and transmits the packets of data over the communication link in accordance with the flow control signal and the second control clock.

11. The communication device according to claim 9, wherein the multi-logic controller block further comprises:

a rule weight modifier element operatively coupled to the hysteresis element and the flow control block, the rule weight modifier element adapted to modify the weight of at least one rule of the one or more rules of the rule base in order to change the flow control signal generated for a given operating condition of the communication device.

12. The communication device according to claim 9, wherein the communication device is a two-way radio and the heat-sensitive module is a radio frequency power amplifier (RF PA).

13. A radio communication device capable of receiving and transmitting information, comprising:

a heat-sensitive module of the radio communication device having a temperature that is affected by transmission of information by the radio communication device;

a temperature sensor element that measures the temperature of the heat-sensitive module;

a multi-logic controller block that receives the temperature of the heat-sensitive module and a first control clock and generates a flow control signal having hysteresis, comprising:

a temperature monitoring element operatively coupled to the heat-sensitive module that periodically monitors the temperature of the heat-sensitive module in accordance with the first control clock provided to the temperature monitoring element and generates a rate of change of temperature (dT/dt) from the temperature of the heat-sensitive module;

a multi-value logic controller coupled to the temperature monitoring element that receives the temperature and the dT/dt and generates an output signal, the multi-value logic controller adapted to:

process the temperature over a temperature range to generate a scaled temperature and process the dT/dt over a dT/dt range to generate a scaled dT/dt;

sort the scaled temperature into one or more temperature membership functions of a plurality of temperature membership functions that each define a sub-range of the temperature range and sorting the scaled dT/dt into one or more dT/dt membership functions of a plurality of dT/dt membership functions that each define a sub-range of the dT/dt range;

determine degree of membership of the scaled temperature in the one or more temperature membership functions into which the scaled temperature is sorted and determine degree of membership of the scaled dT/dt in the one or more dT/dt membership functions into which the scaled dT/dt is sorted;

evaluate one or more rules of a plurality of rules of a rule base of the radio communication device, each rule of the plurality of rules having a weight, in accordance with the degree of membership of the scaled temperature in the one or more temperature membership functions and the degree of membership of the scaled dT/dt in the one or more dT/dt membership functions to generate a rule strength for each rule of the one or more rules; and select a rule of the one or more rules having the greatest rule strength; and a hysteresis element coupled to the multi-value logic controller adapted to add hysteresis to the selected rule to generate the flow control signal;

a data communication protocol element coupled to the hysteresis element that receives the flow control signal, information to be transmitted by the radio communication device, and a second control clock, the data communication protocol element adapted to process the information to be transmitted, according to a plurality of transmission parameters that govern transmission of the information over a communication link and according to the second control clock, to produce packets of data for transmission over the communication link;

a memory element that receives the packets of data generated by the data communication protocol element and contains instructions for implementing the functionality of the data communication protocol, the temperature monitoring element, the multi-value logic controller, and the hysteresis element;

an antenna element;

a transceiver switch element coupled to the antenna element and to the heat-sensitive module;

a radio controller coupled to the temperature sensor element, the temperature monitoring element, the memory, the transceiver switch element, and the receiver element, wherein the radio controller receives the temperature from the temperature sensor and instructions for implementing the functionality of the data communication protocol from the memory element and generates a transmission control signal; and a transmitter element coupled to the radio controller and the heat-sensitive module that receives the transmission control signal from the radio controller and transmits the packets of data over the communication link in accordance with the transmission control signal.

14. The radio communication device according to claim 13, wherein the multi-logic controller block further comprises:

a rule weight modifier element operatively coupled to the hysteresis element and the radio controller, the rule weight modifier element adapted to modify the weight of at least one rule of the one or more rules of the rule base in order to change the flow control signal generated for a given operating condition of the radio communication device.

15. The radio communication device according to claim 13, wherein the heat-sensitive module is a radio frequency power amplifier (RF PA).

* * * * *